(12) United States Patent
Kubota et al.

(10) Patent No.: US 7,094,639 B2
(45) Date of Patent: Aug. 22, 2006

(54) METHOD FOR FABRICATING SEMICONDUCTOR DEVICE

(75) Inventors: Masafumi Kubota, Osaka (JP); Shigenori Hayashi, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/662,288

(22) Filed: Sep. 16, 2003

(65) Prior Publication Data

US 2004/0087124 A1 May 6, 2004

(30) Foreign Application Priority Data

Nov. 1, 2002 (JP) .................................... 2002-319909

(51) Int. Cl.
*H01L 21/336* (2006.01)
*H01L 21/8234* (2006.01)

(52) U.S. Cl. ........................ 438/197; 438/535

(58) Field of Classification Search ................ 438/197, 438/239, 381, 394, 535, 795
See application file for complete search history.

(56) References Cited

U.S. PATENT DOCUMENTS

| | | | | | |
|---|---|---|---|---|---|
| 5,049,957 | A | * | 9/1991 | Inoue et al. | 257/296 |
| 6,146,938 | A | * | 11/2000 | Saida et al. | 438/239 |
| 6,632,729 | B1 | * | 10/2003 | Paton | 438/535 |
| 6,747,748 | B1 | * | 6/2004 | Matsudo et al. | 356/632 |

FOREIGN PATENT DOCUMENTS

| | | |
|---|---|---|
| JP | 8-124923 | 5/1996 |
| JP | 2001-168325 A | 6/2001 |
| JP | 2001-223367 A | 8/2001 |
| JP | 2002-057301 A | 2/2002 |
| JP | 2002-164514 A | 6/2002 |
| JP | 2003-298020 A | 10/2003 |
| JP | 2003-298021 A | 10/2003 |

OTHER PUBLICATIONS

Noriyuki Miyata et al., "Thermal Stability of $HfO_2$/Ultrathin–$SiO_2$/Si Structures", Extended Abstracts of the 2002 International Conference on Solid State Devices and Materials, Nagoya, pp478–479, 2002.

Shigenori Hayashi et al., "Preparation and characterization of high–k gate dielectric films by reactive sputtering", The $60^{th}$ Sympo. Semiconductors and Integrated Circuits Technology, pp 12–16.

* cited by examiner

*Primary Examiner*—Phuc T. Dang
(74) *Attorney, Agent, or Firm*—McDermott Will & Emery LLP

(57) ABSTRACT

An underlying insulting film of silicon oxide, a gate insulating film of hafnium oxide, a gate electrode of polysilicon, and side walls of silicon oxide are formed above an element formation region of a semiconductor substrate. In the upper portion of the element formation region of the semiconductor substrate, source and drain areas and extension areas are formed by implantations of respective types. Thereafter, the scan speed of the semiconductor substrate and the pulse interval and the peak power of laser beam are adjusted to irradiate only the vicinity of the surface of the semiconductor substrate with laser beam for 0.1 second so that the vicinity of the surface of the semiconductor substrate has a temperature of 1150 to 1250° C. Thus, heat treatments for the gate insulating film and the source and drain areas are performed.

24 Claims, 5 Drawing Sheets

METHOD FOR FABRICATING SEMICONDUCTOR DEVICE

BACKGROUND OF THE INVENTION

The present invention relates to methods for fabricating a semiconductor device having an insulating film of high dielectric such as hafnium oxide ($HfO_2$) or zirconium oxide ($ZrO_2$).

In recent years, further miniaturization of a MIS transistor has reduced the thickness of a gate insulating film provided in the transistor, which has offered the transistor with high driving power. The thinned gate insulating film, however, causes a direct tunnel current flow between a gate and a channel and an increase in the direct tunnel current boosts the power consumption of the transistor.

Generally, a fine MOS integrated circuit having a gate length of 0.10 µm or smaller requires a very thin gate insulating film whose equivalent silicon oxide thickness Eot is 2 nm or smaller. The equivalent silicon oxide thickness refers to the thickness of an insulating film necessary for having capacitance equivalent to that of a silicon oxide film. In the case where silicon oxide ($SiO_2$) is used for the insulating film, when the thickness thereof is reduced to 2 nm or smaller, tunnel current becomes predominant. Probably, an insulating film of silicon oxide having a thickness of 1.2 nm or smaller cannot be used in a practicable element.

To realize both high driving power and low power consumption, a high dielectric constant insulating film having a higher dielectric constant than silicon oxide is being employed as the gate insulating film.

In capacitors included in, for example, an embedded LSI in which a DRAM portion and a logic portion are embedded within one chip, a capacitor insulating film is conventionally made of silicon oxide. Like the MIS transistor, as the capacitor insulating film is thinned, tunnel current increases. As a result, the charge holding time of the capacitor may be shortened. To solve this problem, consideration is being made of the use of a high dielectric constant material in the capacitor insulating film of this capacitor.

For example, a high dielectric thin film of metal oxide containing hafnium (Hf) or zirconium (Zn) is generally formed by a film growth technique such as sputtering, metal organic chemical vapor deposition (MOCVD), atomic layer chemical vapor deposition (ALCVD), or molecular beam epitaxy (MBE).

When a transistor is formed by a series of process steps of depositing a gate insulating film of high dielectric, forming a gate electrode, and forming a dopant junction in a source and a drain, that is to say, by a self alignment process, it is necessary to perform, after the dopant introduction into the source and drain, heat treatment for heating the introduction regions to about 900° C. in order to form dopant junctions causing small leakage current.

Instead of the self alignment process, a so-called replacement process in which source and drain areas are formed prior to the formation of a gate insulating film is assumed to be applied. Even in the case of the replacement process, other than an MBE technique in which a high dielectric thin film is epitaxially grown in ultrahigh vacuum, it is essential for any film growth technique to perform heat treatment at 700° C. or higher in order to provide a gate insulating film of good insulation properties (See, e.g., Shigenori Hayashi, et al., "Fabrication and Evaluation of High Dielectric Constant Gate Insulating Film by Reactive Sputtering" The 60th Symposium on Semiconductors and Integrated Circuits Technology, Electronic Material Committee in the Electrochemical Society of Japan (June, 2001) pp. 12–16).

Heat treatment at high temperatures, however, causes silicidation reaction by the reaction of metal with silicon or crystallization by an oxide, and thus a boundary is formed between the regions where the composition of the film is changed and not changed. This decreases the insulation properties of the film (See, e.g., Noriyuki Miyata, et al., "Thermal Stability of $HfO_2$/Ultrathin-$SiO_2$/Si structures" Extended Abstracts of the 2002 International Conference on Solid State Devices and Materials, Nagoya (2002) pp. 478–479).

In general, when these high dielectric materials are subjected to heat treatment at 600° C. or higher, however, they react with silicon constituting a substrate or they suffer from grain boundaries by the crystallization of themselves and film thickness ununiformity by their phase change. This increases leakage current and decreases breakdown voltage.

Moreover, by traces of oxygen contained in the atmosphere used during the heat treatment and oxygen contained in a silicon substrate and an insulating film, a silicon oxide film or a compound film made by the reaction of high dielectric with silicon (a so-called silicate thin film) is formed at the interface between the high dielectric film and the silicon substrate. The dielectric constants of the silicon oxide film and the silicate thin film range from a half to a smaller fraction of that of the high dielectric material, so that the formation of these films corresponds to the insertion of a capacitor in series with the high dielectric film. Accordingly, the effective dielectric constant thereof decreases.

As is apparent from the above, improvement of the heat treatment technique is essential to formation of a gate insulating film of high dielectric suitable for practical use.

Also in the case where the high dielectric materials are used for a capacitor insulating film of a capacitor, the same problems arise. To be more specific, when a silicon substrate is used for one electrode of the capacitor, an oxide film of low dielectric constant tends to be formed at the interface between the insulating film and the silicon substrate as in the case of the gate insulating film.

For a capacitor formed in a sandwich structure in which metal electrodes vertically sandwich an insulating film of high dielectric, or in a so-called MIM structure, how the reaction of the high dielectric film with the underlying and overlying metal electrodes is minimized becomes a big problem.

SUMMARY OF THE INVENTION

With the above-mentioned conventional problems in mind, an object of the present invention is to enable application of a high dielectric thin film of metal oxide to a gate insulating film or a capacitor insulating film.

From various studies of the high dielectric film of metal oxide designed for the gate insulating film of the MIS transistor or the capacitor insulating film, the inventors obtained the following findings.

In a fabrication process of a semiconductor integrated circuit device, it is essential to perform heat treatment at about 600 to 1000° C. For example, in the process step of introducing dopants into a substrate of silicon by ion implantation, implanted dopant ions disturb the configuration of the silicon crystal and then cause defects such as interstitial silicon atoms and lattice vacancies. To recover these crystal defects, heat treatment typically at about 600 to 1000° C. is required.

When the gate insulating film, for example, of high dielectric is formed at low temperatures, a number of defects remain in the film. Therefore, it is necessary to recover these defects by heat treatment. For example, in the case where a high dielectric material such as hafnium oxide ($HfO_2$) or zirconium oxide ($ZnO_2$) is used for the gate insulating film, there are a number of oxygen deficiencies in the film immediately after the deposition (as-depo film), so that heat treatment in an oxygen atmosphere at about 600 to 900° C. is required after the deposition.

As described above, when the high dielectric film made of metal oxide of these types is heated at about 600° C., the crystal defects therein are recovered and thus its insulation properties are improved. However, the film also suffers from grain boundaies by the crystallization of itself and film thickness ununiformity by its phase change. This increases leakage current through the high dielectric film and decreases breakdown voltage of the film.

The crystallization and phase change in the high dielectric film are considered to be a stable condition of atoms having the minimum free energy provided as a result of random and large-scale movement of the atoms in the film. Such random movement of atoms is simulated as a mechanism similar to diffusion. To be more specific, the diffusion distance of an atom as the diffusion length L is estimated as the following Equation (1):

$$L = \sqrt{(D \cdot t)} \tag{1}$$

where D is the diffusion coefficient, and t is the diffusion time.

For example, the diffusion coefficient D of boron (B) in silicon (Si) is about $10^{-14}$ $cm^2/s$ at 1000° C.

The diffusion coefficient value of an atom constituting the high dielectric film is unknown. Provided that the atom moves randomly at a speed comparable to that of a dopant in silicon, the diffusion length L is about 25 nm for a diffusion time t of ten minutes. Therefore, the rearrangement of atoms occurs in a gate insulating film having a thickness of 5 nm, which might increase leakage current.

If the heat treatment time is set at 0.1 second, the diffusion length L is about 0.3 nm. Since the shortest interatomic distance within a silicon crystal is 0.24 nm, the atoms having moved stay in close proximity to positions at which the atoms had existed before the move. Therefore, the extremely short-time heat treatment enables prevention of the crystallization and phase change in the high dielectric film.

A conventional heat treatment technique has a problem of growing a silicon oxide film at the interface between a silicon substrate and a high dielectric film during the heat treatment in an oxidizing atmosphere. However, the extremely short-time heat treatment enables suppression of the film growth as well. Accordingly, by optimizing a deposition method of a high dielectric film, the growth of a silicon oxide film even at 1000° C. can be suppressed, by heat treatment for 0.1 second, to about 0.1 to 0.2 nm.

To attain the above object based on these findings, a method for fabricating a semiconductor device of the present invention comprises a first step of forming an insulating film of high dielectric on a substrate, and a second step of irradiating light onto the substrate on which the insulating film is formed.

With the semiconductor device fabrication method of the present invention, the light is irradiated onto the substrate on which the insulating film of high dielectric is formed. If the wavelength of this light is set at a wavelength such that the substrate can absorb the light, an extremely short-time heat treatment of 0.1 second or less can be performed only in the vicinity of the substrate surface. Therefore, when the insulating film of high dielectric is employed as a gate insulating film or a capacitor insulating film, it is possible to prevent leakage current flow resulting from the crystallization or phase change of the insulating film. At the same time, crystal defects in the substrate can be recovered while the growth of an oxide film at the interface of the substrate with the insulating film is suppressed. As a result, a semiconductor device having a small leakage current can be provided while the electrically-equivalent silicon oxide thickness of the film therein is kept small.

Moreover, with this method, a local heat treatment can be performed in the vicinity of the substrate surface. This enables a short-time heat treatment of 0.1 second or less. In order to heat to elevated temperatures the entire wafer and in addition a holder for holding the wafer, a very large heat source is required. Once the temperature of the wafer or the holder rises high, it does not drop immediately because of a high heat capacity of the wafer or the holder, which hinders a short-time heat treatment. Furthermore, with this method, only the vicinity of the substrate surface, that is, only a local area is heated. This provides high energy utilization efficiency and reduces loads to the environment.

In the inventive fabricating method, the insulating film is preferably a gate insulating film of a transistor.

In this case, it is preferable that the inventive fabricating method further comprises, between the first and second steps, the step of selectively introducing dopants into the substrate. This step configuration enables formation of a dopant diffusion layer which has an extremely shallow junction and a low resistance.

Also in this case, it is preferable that the inventive fabricating method further comprises, between the first and second steps, the step of forming a conductor film on the insulating film. This step configuration enables enhancement of the uniformity of heat treatment performed on the insulating film of high dielectric.

In the inventive fabricating method, the insulating film is preferably a capacitor insulating film of a capacitor.

In this case, it is preferable that the inventive fabricating method further comprises, prior to the first step, the step of selectively introducing dopants into the substrate.

In the inventive fabricating method, the substrate is preferably made of silicon.

In the inventive fabricating method, the insulating film preferably contains a metal element.

In this case, the insulating film preferably contains at least one of hafnium (Hf), zirconium (Zr), lanthanum (La), cerium (Ce), praseodymium (Pr), neodymium (Nd), yttrium (Y), and aluminum (Al).

In the inventive fabricating method, the second step is preferably conducted while the partial pressure of an oxygen gas or an oxygen compound gas is adjusted.

In the inventive fabricating method, the atmosphere used in the second step is preferably composed of a nitrogen gas or an inert gas.

Depending upon the film formation technique, when an insulating film of high dielectric is formed at too high a partial pressure of oxygen, oxygen having passed through the insulating film easily reacts with a substrate. As a result, a silicon oxide film tends to be formed at the interface of the substrate with the insulating film. However, heat treatment for the insulating film of high dielectric is performed either while the partial pressure of the oxygen gas or the oxygen compound gas is adjusted or while the nitrogen gas or the inert gas atmosphere is used, which suppresses formation of the silicon oxide film or the like at the interface of the substrate with the insulating film.

In the inventive fabricating method, the substrate is preferably heated to 100 to 500° C. in the second step.

DETAILED DESCRIPTION OF THE PREFERRED EMBODIMENTS (First Embodiment)

A first embodiment of the present invention will be described below with reference to the accompanying drawings.

Figure 1:
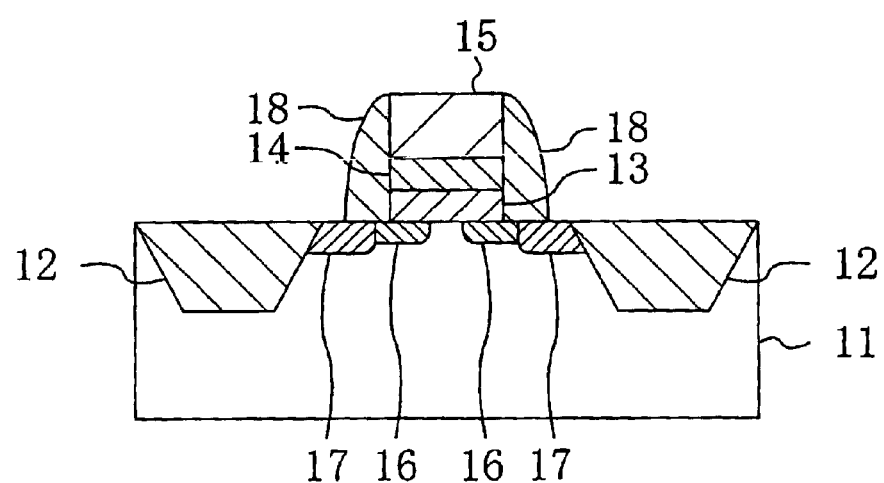
FIG. 1 is a sectional drawing schematically illustrating a construction of a semiconductor device according to a first embodiment of the present invention.

FIG. 1 is a drawing illustrating a semicoinductor device according to die first embodiment of the present invention and schematically showing a cross-sectional construction of a MIS transistor.

Referring to FIG. 1, trench isolation regions 12 of silicon oxide ($SiO_2$) are formed in the upper portion of a semiconductor substrate 11 of p-type silicon (Si), for example. The main surface of the semiconductor substrate 11 is defined by the trench isolation regions 12, and the defined region serves as an element formation region.

An underlying insulting film 13 of silicon oxide having a thickness of about 0.5 nm, a gate insulating film 14 of high dielectric such as hafnium oxide ($HfO_2$) having a thickness of about 4 nm, and a gate electrode 15 of n-type polysilicon are formed, in the listed order, above the element formation region.

In areas of the upper portion of the element formation region which are located below both ends of the underlying insulting film 13 in the direction of the gate length, n-type extension areas 16 are spacedly provided which are formed by shallowly implanting an n-type dopant. The n-type extension areas 16 serve to suppress short channel effect caused in the transistor and to enhance the driving power thereof. In areas of the upper portion of the element formation region which are located outside the extension areas 16, n-type source and drain areas 17 are formed by implantation. The n-type source and drain areas 17 have inward edges connected to the respective extension areas 16 and have junction faces deeper than those of the extension areas 16.

On the both side surfaces of the gate electrode 15 in the direction of the gate length as well as the side surfaces of the underlying insulting film 13 and gate insulating film 14 in the same direction, side wall films 18 are provided which are formed from an insulating film of silicon oxide, silicon nitride or the like.

Hereinafter, a method for fabricating the MIS transistor thus constructed will be described using the accompanying drawings.

FIGS. 2A through 2D and FIG. 3 are sectional views schematically showing process steps of a fabricating method of a semiconductor device according to the first embodiment of the present invention step by step. Herein, the semiconductor substrate 11 represents part of a wafer on which integrate circuits composed of a plurality of functional elements such as MIS transistors are formed.

Figure 2A:
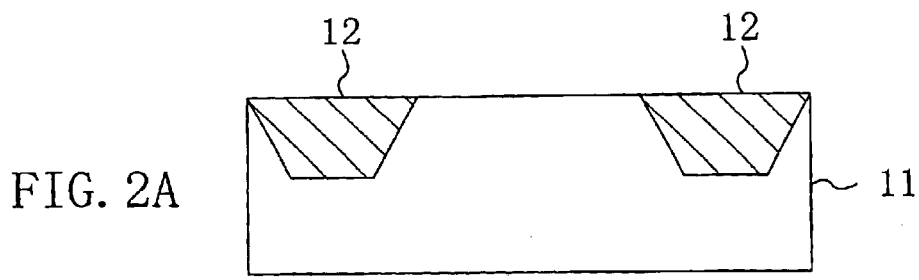
FIGS. 2A through 2D are sectional views schematically showing process steps of a fabricating method of a semiconductor device according to the first embodiment of the present invention step by step.

First, as shown in FIG. 2A, trenches (grooves) are selectively formed by a publicly known technique in the upper portion of the semiconductor substrate 11 of p-type silicon. The formed trenches are filled with silicon oxide to form trench isolation regions 12.

Figure 2B:
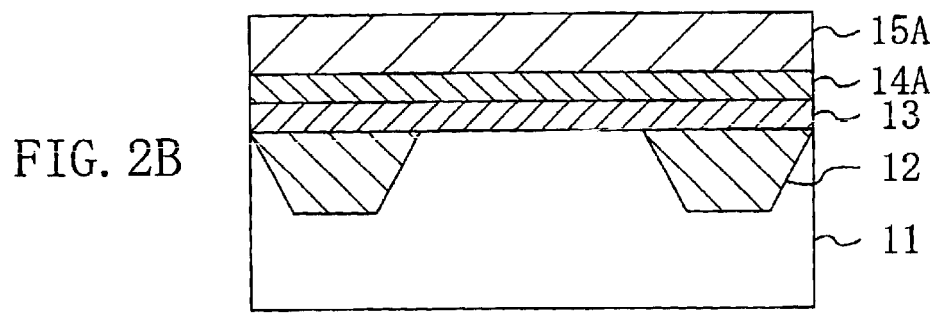
Figure 2C:
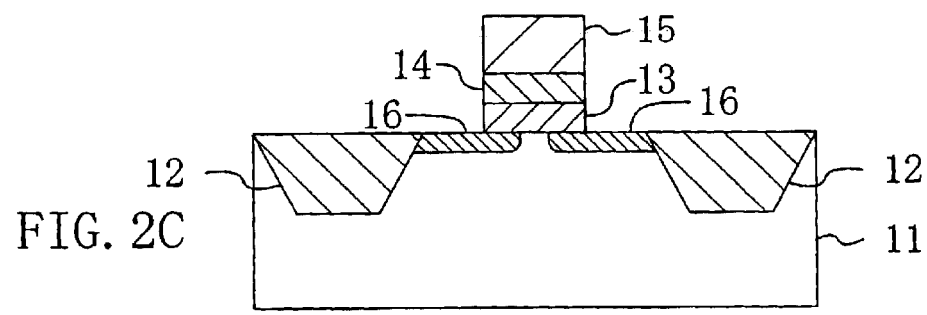

Subsequently, as shown in FIG. 2B, an underlying insulating film 13 of silicon oxide having a thickness of about 0.5 to 1.0 nm is formed by thermal oxidation on the entire surface of the semiconductor substrate 11 including the surfaces of the trench isolation regions 12. On the formed underlying insulating film 13, a high dielectric insulating film 14A is deposited by reactive sputtering in an oxygen atmosphere. The high dielectric insulating film 14A for forming a gate insulating film is made of hafnium oxide ($HfO_2$) and has a thickness of about 5 nm. On the high dielectric insulating film 14A, a gate electrode formation film 15A of polysilicon having a thickness of about 250 nm is deposited by low pressure chemical vapor deposition (LPCVD). The material of the gate electrode formation film 15A is not limited to polysilicon. Alternatively, silicon germanium (SiGe) can be used for the film to reduce its resistance. As another forming method of the underlying insulating film 13, nitrogen is introduced to form the underlying insulating film 13 of silicon oxynitride by plasma nitriding. Thus, oxidation of the surface of the semiconductor substrate 11 can be suppressed in depositing the high dielectric insulating film 14A. Moreover, when dopants are introduced into the gate electrode formation film 15A later on, the dopants can be prevented from diffusing into the semiconductor substrate 11.

On the gate electrode formation film 15A, a resist pattern (not shown) including a gate electrode pattern is formed by lithography. Using the formed resist pattern as a mask, the gate electrode formation film 15A is dry etched by halogen gas plasma to form a gate electrode 15 from the gate electrode formation film 15A. During this etching, the upper portion of the high dielectric insulating film 14A, or the high dielectric insulating film 14A as well as the upper portion of the underlying insulating film 13 is also etched. Thereafter, dopant ions are implanted into the semiconductor substrate 11 using the obtained gate electrode 15 as a mask. This implantation introduces the dopant ions into both the upper portion of the semiconductor substrate 11 and the gate electrode 15. The implanted dopant ions are then activated by heat treatment to form extension areas 16 in the upper portion of the semiconductor substrate 11. For an n-channel transistor to be formed, the dopant used in this process step is an n-type dopant such as arsenic (As). On the other hand, for a p-channel transistor to be formed, the dopant used in this process step is a p-type dopant such as boron (B). In the case of the p-channel transistor, however, it is necessary to form in advance an n-type well having a greater depth than the source and drain areas 17 in the element formation region of the semiconductor substrate 11. Subsequently, all the high dielectric insulating film 14A and the underlying insulating film 13 but the portions thereof located below the gate electrodes 15 are removed by wet etching with an aqueous solution containing hydrogen fluoride (HF) for about one minute. This forms a gate insulating film 14 from the high dielectric insulating film 14A, thereby providing a construction shown in FIG. 2C.

Figure 2D:
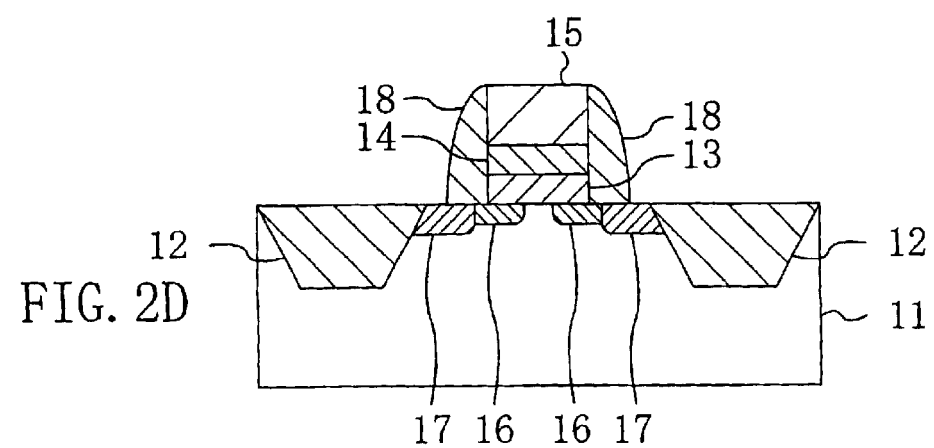

By a CVD technique, an insulating film of silicon nitride ($Si_3N_4$) or silicon oxide ($SiO_2$) having a thickness of about 100 to 200 nm is deposited on the entire surface of the semiconductor substrate 11 including the gate electrode 15. The deposited insulating film is anisotropically etched by reactive ion etching with gas plasma containing tetrafluoromethane ($CF_4$) and trifluoromethane ($CHF_3$) as etching gas species, thereby forming side wall films 18 from the insulating film on the side surfaces of the gate electrode 15. The shape of each of the side wall films 18 depends upon the thickness of the insulating film deposited. Using the gate electrode 15 and the side wall films 18 as a mask, dopants for forming the source and drain areas 17 are implanted into the upper portion of the semiconductor substrate 11. Also in this implantation, for an n-channel transistor to be formed, the dopant used is arsenic, for example, and for a p-channel transistor to be formed, the dopant used is boron, for example. Note that in the case of the p-channel transistor, it is preferable to implant, prior to the ion implantation for forming the source and drain areas 17, germanium (Ge) ions at an acceleration energy of about 30 to 100 keV and a dose of about $1\times10^{15}/cm^2$ to $5\times10^{15}/cm^2$ to amorphize the upper portion of the semiconductor substrate 11, that is to say, it is preferable to perform preamorphizing implantation (PAI). The PAI serves to make the source and drain areas 17 shallow junctions. Since the boron ion used in forming the p-channel transistor has a small mass, it is difficult to amorphize the source and drain areas 17. The PAI is performed for promoting the amorphization. On the other hand, for the arsenic ion used in the formation of the n-channel transistor, the PAI need not be performed because the upper portion of the semiconductor substrate 11 is amorphized by the arsenic-ion implantation. After the dopant implantation into the source and drain areas 17, a construction shown in FIG. 2D is obtained.

Figure 3:
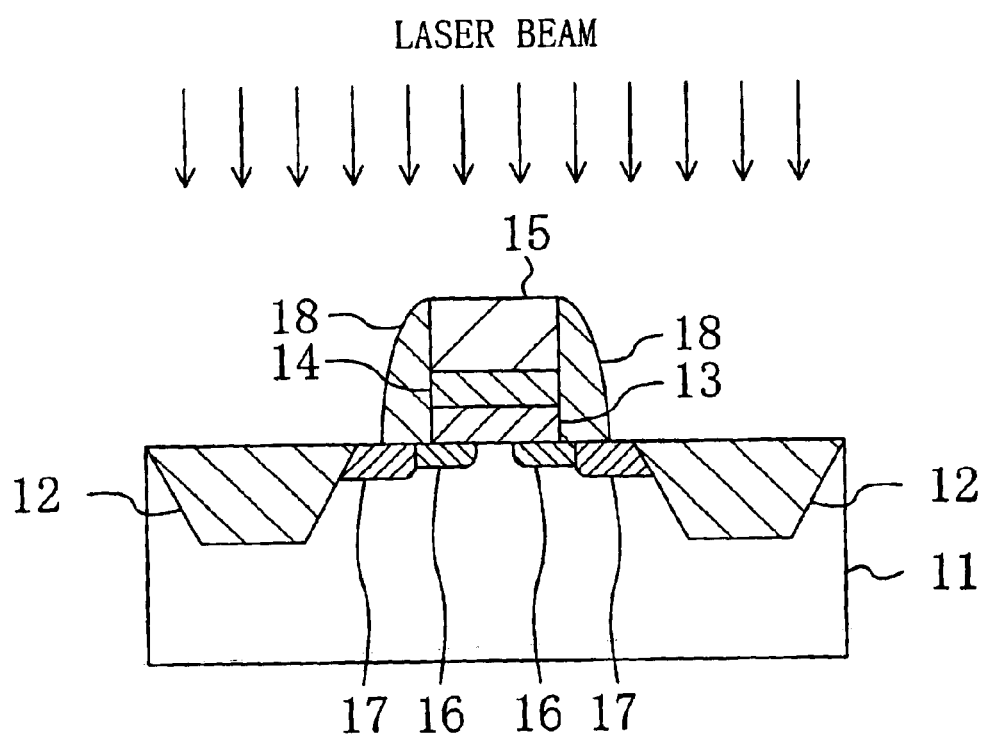
FIG. 3 is a sectional view schematically showing a process step of the fabricating method of a semiconductor device according to the first embodiment of the present invention step by step.

Next, as shown in FIG. 3, heat treatments for the gate insulating film 14 and the ion-implanted source and drain areas 17 are simultaneously performed using laser beam. The heat treatment is done in a nitrogen ($N_2$) atmosphere having a pressure of about 250 Pa and containing oxygen ($O_2$) at a partial pressure of about 9 to 11 Pa. Although the optimum partial pressure of oxygen depends upon the pressure of a background gas or the like, the partial pressure of oxygen is preferably about 1 to 100 Pa The reason for this is as follows. Too high a partial pressure of oxygen causes reduction of the effective dielectric constant of the insulating film because of a silicon oxide layer formed at the interface of the semiconductor substrate 11 with the underlying insulating film 13 by the reaction of oxygen atoms passing through the gate insulating film 14 and the underlying insulating film 13 with silicon atoms constituting the semiconductor substrate 11. In contrast to this, too low a partial pressure of oxygen hinders the process repeatability applicable for practical use because of outgas released from, for example, the wall of a chamber for the heat treatment or leakage caused in the chamber.

In order to heat only the vicinity of the surface of the semiconductor substrate 11, as the laser beam employed in the heat treatment, use is made of a source of beam whose photon energy is greater than the band gap of silicon, that is to say, a source of beam having a wave length less than 0.4 µm capable of being absorbed by silicon. For example, $XeCl_2$ excimer laser beam having a wave length of 308 nm and a beam output of about 15 W is employed as this beam. In this process step, the laser beam is expanded with a beam expander and passes through a slit variable in angle of view to change the expanded beam into laser beam about 30 mm square. The resulting beam is irradiated onto the semiconductor substrate (wafer) 11. To be more specific, the main surface side of the semiconductor substrate 11 is repeatedly scanned and exposed using the same method as a step and repeat exposure system. The scan speed of the semiconductor substrate 11 and the pulse interval and the peak power of the laser beam are adjusted to subject only the vicinity of the surface of the semiconductor substrate 11 to heat treatment at an irradiation energy of 0.4 to 0.6 $J/cm^2$ for 0.1 second per irradiation area so that the vicinity of the surface of the semiconductor substrate 11 has a temperature of 1150 to 1250° C. Since the absorption coefficient of the semiconductor substrate 11 is great in this case, the portion of the substrate tens of nanometers deep from the substrate surface becomes high temperature over 1100° C. As is shown above, the surface of the semiconductor substrate 11 is locally heated, thereby enabling simultaneous heat treatments for making up for oxygen deficiencies for the gate insulating film 14 and for recovering the crystallinity and activating the dopants of the source and drain areas 17. Moreover, only the vicinity of the surface of the semiconductor substrate 11 can be treated for a very short time and at elevated temperatures, so that this process step has advantageous energy utilization efficiency. Furthermore, temperature control of a wafer holder releases strain which is caused in the wafer by performing a short-time heat treatment, which prevents cracks in the wafer, slacks in the thin films provided on the wafer surface, and interconnect separations in circuits of the device.

In the first embodiment, the semiconductor substrate 11 is heated at about 100 to 500 ° C. This decreases the temperature difference between the substrate surface and the substrate inside, thereby reducing stresses placed on the semiconductor substrate 11. As a result, the controllability and repeatability of temperature of the substrate surface can be improved.

Since the source and drain areas 17 thus provided are implanted, prior to the heat treatment, either with arsenic ions for the n-channel transistor or boron ions and germanium ions for the p-channel transistor to amorphize the areas, the sheet resistances of the areas as extremely low as 80 to 300 Ω can be obtained even though the junction depths of the ion-diffusing areas are as shallow as 0.2 µm or smaller. The reason why such a low resistance is obtained is probably that the amorphized areas fuse at temperatures 200 to 300° C. lower than the melting point of a silicon monocrystal and that dopants contained in the source and drain areas 17 are trapped into the silicon monocrystal in a metastable state.

In addition, laser beam irradiation enables an extremely short-time heat treatment of 0.1 second, so that a resulting increase in thickness of the underlying insulating film 13 provided below the gate insulating film 14 is suppressed to an extremely small extent and the increment thereof is about 0.2 nm. Experiments estimate that at temperatures over 1100° C., the diffusion coefficient of oxygen contained in hafnium oxide ($HfO_2$) is far in excess of $10^{-14}$ $cm^2/s$ and contained oxygen reaches the surface of the semiconductor substrate 11 easily. In the first embodiment, however, heat treatment is done both at a reduced partial pressure of oxygen and for an extremely short time of 0.1 second, so that oxidation of the semiconductor substrate 11 hardly proceeds.

Thereafter, interlayer insulating films and interconnects for electrodes are formed above the semiconductor substrate 11 to obtain the MIS transistor.

The MIS transistor thus obtained has extremely small leakage currents caused between the gate electrode 15 and the semiconductor substrate 11 and between the source and drain areas 17. The gate insulating film 14 thereof has an equivalent silicon oxide film thickness Eot of 1.1 nm at the minimum, so that the gate leakage current thereof can be reduced by three or four orders of magnitude as compared to a gate insulating film of silicon oxide equivalent to the gate insulating film 14.

In the first embodiment, hafnium oxide is used as the high dielectric insulating film 14A, but the film is not limited to this material. Alternatively, use may be made of an oxide or a silicate containing, instead of hafnium (Hf), at least one of zirconium (Zr), lanthanum (La), cerium (Ce), praseodymium (Pr), neodymium (Nd), yttrium (Y), and aluminum (Al). Also, insulating materials referred to as so-called high dielectric constant insulating materials can attain the same effect as hafnium oxide. The oxide or silicate containing the element or elements above listed has a relatively high dielectric constant and a strong bond with oxygen, which is advantageous for the formation of a stable film.

The high dielectric insulating film 14A may be formed in a stacked structure in which multiple insulating films are stacked, or in a laminated structure in which a number of very thin films are laminated. In the fabricating method of the first embodiment, heat treatment is performed in a very short time, so that any insulating film laminated as part of the high dielectric insulating film 14A can maintain its good insulation properties.

The underlying insulating film 13 is not necessarily formed between the semiconductor substrate 11 and the gate insulating film 15. However, it is preferable to form, as an underlying film, silicon oxide which is a thermal oxide film on the semiconductor substrate 11. This is because the junction face (interface) between the silicon substrate and the thermal oxide film has extremely good properties as compared to the case where the high dielectric insulating film 14A is directly deposited on the semiconductor substrate 11.

The semiconductor substrate 11 is not limited to a bulk silicon substrate and alternatively an SOI (silicon on insulator) substrate may be employed as the semiconductor substrate 11.

(Second Embodiment)

A second embodiment of the present invention will be described below with reference to the accompanying drawings.

FIGS. 4A through 4D are sectional views schematically showing process steps of a fabricating method of a semiconductor device according to the second embodiment of the present invention step by step. Also in this description, a semiconductor substrate 11 represents part of a wafer.

Figure 4A:
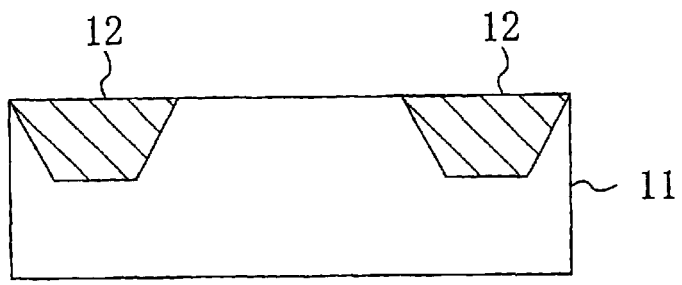
FIGS. 4A through 4D are sectional views schematically showing process steps of a fabricating method of a semiconductor device according to a second embodiment of the present invention step by step.

First, as shown in FIG. 4A, trenches are selectively formed by a publicly known technique in the upper portion of the semiconductor substrate 11 of p-type silicon. The formed trenches are filled with silicon oxide to form trench isolation regions 12.

Figure 4B:
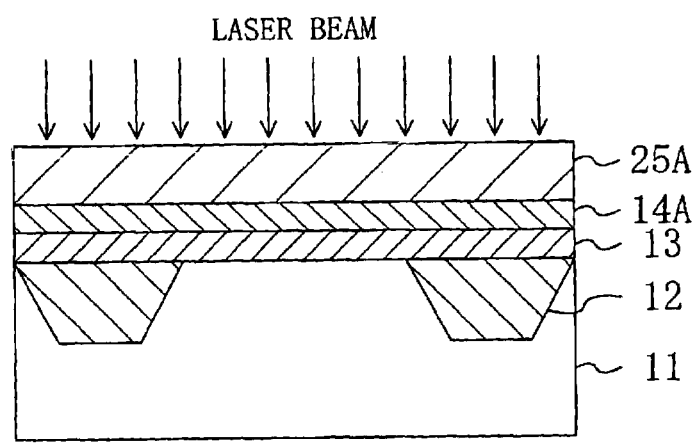

Subsequently, as shown in FIG. 4B, an underlying insulating film 13 of silicon oxide having a thickness of 0.4 nm is formed by thermal oxidation on the entire surface of the semiconductor substrate 11 including the surfaces of the trench isolation regions 12. On the formed underlying insulating film 13, a high dielectric insulating film 14A for forming a gate insulating film is deposited by atomic layer chemical vapor deposition (ALCVD) in which a hafnium tetrachloride ($HfCl_4$) gas and water vapor ($H_2O$) are alternately supplied. The high dielectric insulating film 14A is made of hafnium oxide ($HfO_2$) and has a thickness of about 5 nm. On the high dielectric insulating film 14A, a gate electrode formation film 25A of titanium nitride (TiN) having a thickness of about 150 nm is deposited by sputtering or chemical vapor deposition (CVD). Next, in an argon (Ar) atmosphere containing oxygen at a partial pressure of about 0.9 to 1.1 Pa, the high dielectric insulating film 14A is subjected to heat treatment with laser beam in order to make up for oxygen deficiencies for the high dielectric insulating film 14A. Specifically, the semiconductor substrate 11 is heated to about 300° C. and keeps this temperature. Then, the semiconductor substrate 11 is irradiated with $XeCl_2$ excimer laser beam having a pulse width of about 10 nsec and a beam output of 70 W to selectively heat the gate electrode formation film 25A. Since the gate electrode formation film 25A of titanium nitride has high absorption coefficient for the excimer laser beam and good heat conductivity, the dependence of the heat treatment on pattern density is reduced greatly. By selectively heating the gate electrode formation film 25A, the heat treatment for the gate insulating film 14 can be performed.

The laser beam is expanded with a beam expander and passes through a slit variable in angle of view to change the expanded beam into laser beam about 30 mm square. The resulting beam is irradiated onto the gate electrode formation film 25A. The scan speed of the semiconductor substrate 11 and the pulse interval and the peak power of the laser beam are adjusted to perform heat treatment at an irradiation energy of 0.1 to 0.4 $J/cm^2$ for 0.05 second per irradiation area so that the gate electrode formation film 25A has a temperature of 850 to 950° C. The heat treatment of this process step has an extremely short heating time, so that a resulting increase in thickness of the underlying insulating film 13 provided below the high dielectric insulating film 14A is suppressed to a small extent and the increment thereof is about 0.1 nm or smaller.

Figure 4C:
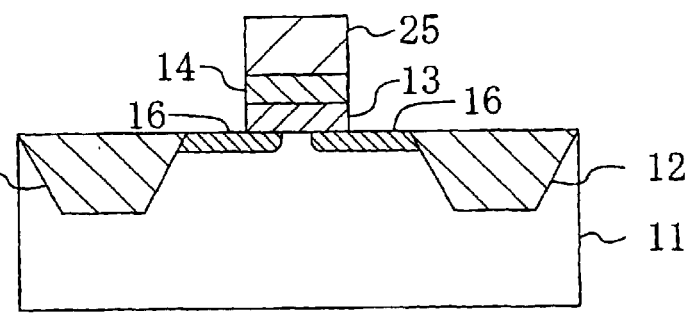

On the gate electrode formation film 25A, a resist pattern (not shown) including a gate electrode pattern is formed by lithography. Using the formed resist pattern as a mask, the gate electrode formation film 25A is etched with plasma mainly composed of chlorine ($Cl_2$) to form a gate electrode 25 from the gate electrode formation film 25A. Thereafter, using the obtained gate electrode 25 as a mask, dopant ions, such as arsenic ions for an n-channel transistor to be formed, are implanted into the semiconductor substrate 11. The implanted arsenic ions are then activated by heat treatment to form extension diffusion areas 16 having relatively shallow junctions in the element formation region of the semiconductor substrate 11. Consequently, a construction shown in FIG. 4C is provided.

Figure 4D:
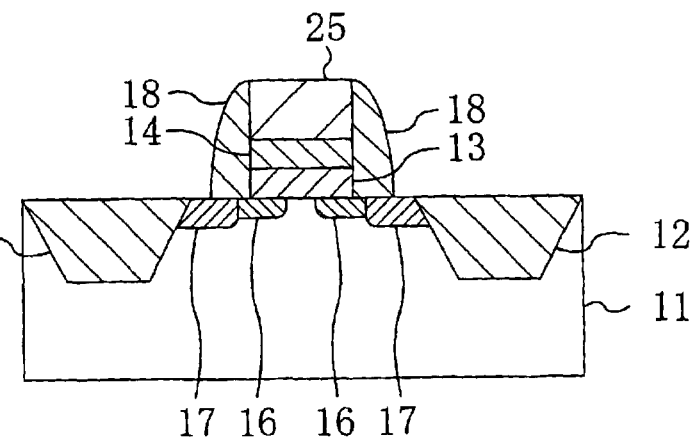

By a CVD technique, an insulating film of silicon nitride or silicon oxide having a thickness of about 100 to 200 nm is deposited on the entire surface of the semiconductor substrate 11 including the gate electrode 25. The deposited insulating film is anisotropically etched by reactive ion etching with etching gas containing fluorocarbons, thereby forming side wall films 18 from the insulating film on the side surfaces of the gate electrode 25. Using the gate electrode 25 and the side wall films 18 as a mask, dopants for forming source and drain areas 17 are implanted into the upper portion of the semiconductor substrate 11. Also in this implantation, for an n-channel transistor to be formed, the dopant used is arsenic, for example, and for a p-channel transistor to be formed, the dopant used is boron, for example. Note that in the case of the p-channel transistor, it is preferable to implant, prior to the ion implantation for forming the source and drain areas 17, germanium (Ge) ions at an acceleration energy of about 30 to 100 keV and a dose of about $1 \times 10^{15}/cm^2$ to $5 \times 10^{15}/cm^2$ to amorphize the upper portion of the semiconductor substrate 11, that is to say, it is preferable to perform pre-amorphizing implantation (PAI). After the dopant implantation into the source and drain areas 17, rapid thermal annealing (RTA) is performed for a minute in a nitrogen atmosphere at about 950° C. to activate the implanted dopant ions. The source and drain areas 17 are thus formed and a construction shown in FIG. 4D is obtained.

Thereafter, interlayer insulating films and interconnects for electrodes are formed above the semiconductor substrate 11 to obtain the MIS transistor.

The MIS transistor thus obtained has the gate electrode 25 composed of metal nitride, so that there is no depletion occurring in the electrode. Moreover, it is confirmed that the gate insulating film 14 thereof has an electrically-equivalent silicon oxide film thickness Eot of 0.9 nm at the minimum and that the leakage current in the case where a voltage of 1 V is applied across the gate electrode 25 and the semiconductor substrate 11 is reduced by two or more orders of magnitude as compared to that of a gate insulating film of silicon oxide having a thickness of about 0.9 nm.

(Third Embodiment)

A third embodiment of the present invention will be described below with reference to the accompanying drawings.

Figure 5A:
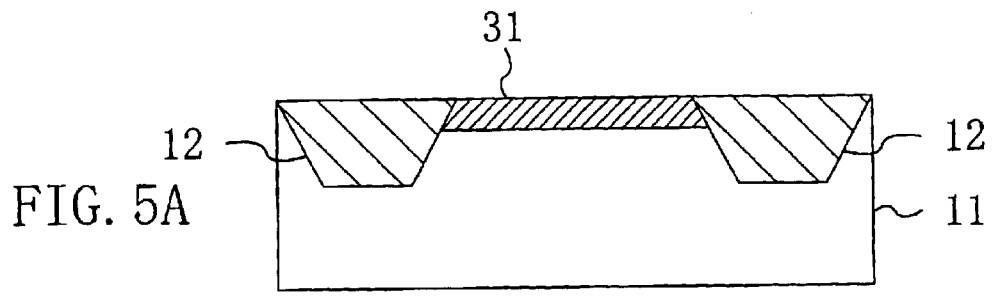
FIGS. 5A through 5C are sectional views schematically showing process steps of a fabricating method of a semiconductor device according to a third embodiment of the present invention step by step.
Figure 5B:
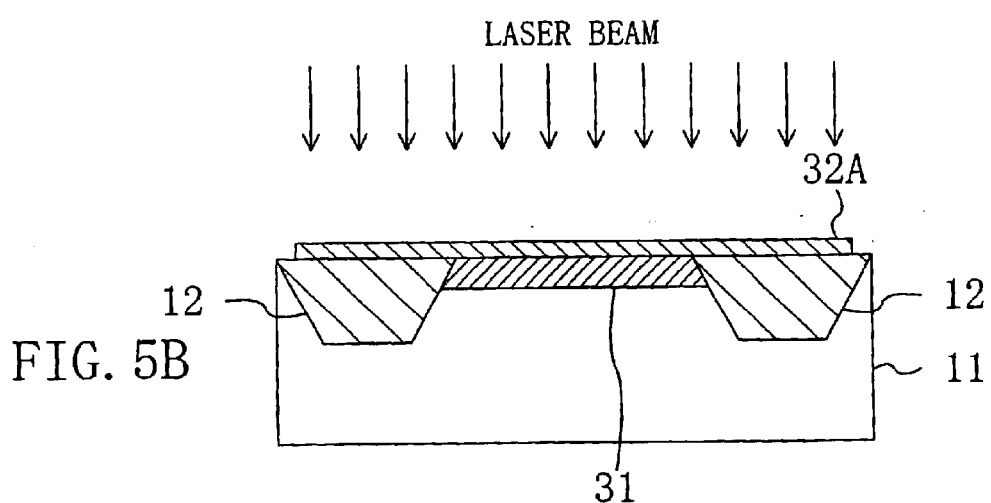
Figure 5C:
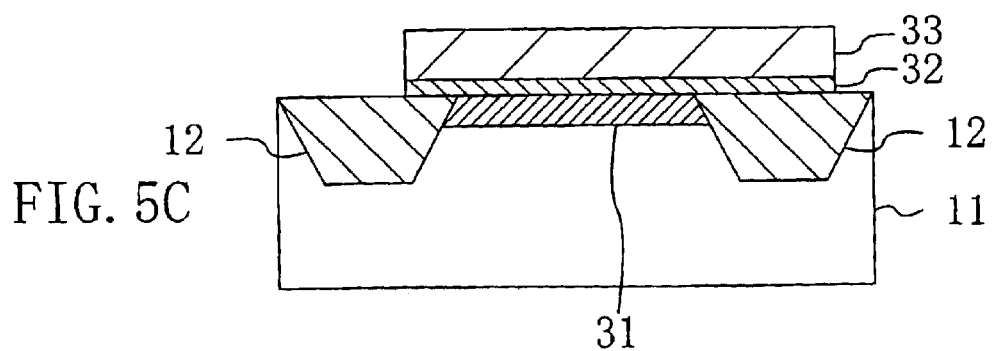

FIGS. 5A through 5C are sectional views schematically showing process steps of a fabricating method of a semiconductor device according to the third embodiment of the present invention step by step. The semiconductor device of the third embodiment is a capacitor in a DRAM. Also in this description, a semiconductor substrate 11 represents part of a wafer.

First, as shown in FIG. 5A, trenches are selectively formed by a publicly known technique in the upper portion of the semiconductor substrate 11 of p-type silicon. The formed trenches are filled with silicon oxide to form trench isolation regions 12. Next, into a region of the semiconductor substrate 11 in which a lower electrode of a capacitor is to be formed, arsenic ions are implanted at an acceleration voltage of about 30 keV and a dose of about $3 \times 10^{15}/cm^2$. Using RTA equipment, heat treatment for five minutes is performed in a nitrogen ($N_2$) atmosphere at about 950° C., thereby forming an n-type diffusion region 31 in the upper portion of the semiconductor substrate.

Subsequently, as shown in FIG. 5B, the semiconductor substrate 11 with the n-type diffusion region 31 formed is subjected to RCA cleaning and heated to about 350° C. On the heated semiconductor substrate 11, a high dielectric insulating film 32A for forming a capacitor insulating film is deposited by an ALCVD technique in which a hafnium tetrachloride gas and water vapor are alternately supplied. The high dielectric insulating film 32A is made of hafnium oxide and has a thickness of about 2 to 5 nm. Next, in a nitrogen atmosphere containing oxygen at a partial pressure of about 0.9 to 1.1 Pa, the high dielectric insulating film 14A is subjected to heat treatment with laser beam in order to make up for oxygen deficiencies for the high dielectric insulating film 32A. Specifically, the semiconductor substrate 11 is heated to about 300° C. and keeps this temperature. Then, the semiconductor substrate 11 is irradiated with $XeCl_2$ excimer laser beam having a pulse width of about 10 nsec and a beam output of about 80 W to selectively heat the vicinity of the surface of the semiconductor substrate 11. During this treatment, the scan speed of the semiconductor substrate 11 and the pulse interval and the peak power of the laser beam are adjusted to perform heat treatment at an irradiation energy of 0.4 to 0.6 $J/cm^2$ for 0.1 second per irradiation area so that the substrate surface has a temperature of about 1000° C. In this process step, the heat treatment for the high dielectric insulating film 32A is done in an extremely short time, so that this treatment hardly changes the crystallinity of the high dielectric insulating film 32A as compared to that of hafnium oxide.

As shown in FIG. 5C, using an LPCVD technique, an upper electrode 33 of phosphorus-doped polysilicon is formed on the high dielectric insulating film 32A. By lithography and reactive ion etching (RIE) with plasma containing chlorine ($Cl_2$), hydrogen bromide (HBr), and oxygen ($O_2$), the upper electrode 33 is patterned and simultaneously a capacitor insulating film 32 is formed from the high dielectric insulating film 32A. Consequently, a capacitor is provided which is composed of the upper electrode 33, the capacitor insulating film 32, and the n-type diffusion region 31.

As is apparent from the above, the capacitor according to the third embodiment attains a capacitor insulating film with a smaller leakage current by two or more orders of magnitude and a higher relative dielectric constant by several times as compared to a conventional capacitor insulating film of silicon oxide. In using this capacitor in a DRAM cell, it is possible to reduce the area of the cell, which is advantageous for the DRAM.

What is claimed is:

1. A method for forming a semiconductor device, comprising the steps of:
    a) forming an insulating film comprising silicon on a substrate;
    b) forming a high dielectric insulating film on the insulating film;
    c) forming a gate electrode on the gate insulating film;
    d) forming a side wall on a side face of the gate insulating film;
    e) forming a source/drain region below the side of the gate insulating film in the substrate; and
    f) irradiating a light onto the substrate having the high dielectric insulating film and the source/drain region, so as to reduce a crystal defect of the high dielectric insulating film.

2. The method of claim 1, wherein the insulating film contains nitrogen.

3. The method of claim 1, wherein the substrate is heated by a heating source other than the light during step f).

4. The method of claim 1, wherein a surface of the substrate has a temperature of 1150 to 1250° C. during step f).

5. The method of claim 1, wherein the light has a wavelength of 0.4 µm or less.

6. The method of claim 3, wherein the substrate is heated to about 100 to 500° C. during step f).

7. The method of claim 1, wherein the high dielectric insulating film contains at least one of hafnium, zirconium, lanthanum, cerium, praseodymium, neodymium yttrium and aluminum.

8. The method of claim 1, wherein a partial pressure of an oxygen gas or an oxygen compound gas is controlled during step f).

9. The method of claim 1, wherein the atmosphere used in step f) includes a nitrogen gas or an inert gas.

10. A method for forming a semiconductor device, comprising the steps of:

a) forming a high dielectric insulating film on a substrate;

b) forming a conductive film on the high dielectric insulating film;

c) irradiating a light onto the substrate having the high dielectric insulating film and the conductive film;

d) forming a gate insulating film and a gate electrode by removing a part of the high dielectric insulating film and the conductive film after step c), e) forming a side wall on a side face of the gate insulating film; and f) forming a source/drain region below the side of the gate insulating film in the substrate.

11. The method of claim 10, wherein a crystal defect of the high dielectric insulating film is reduced during step c).

12. The method of claim 10, wherein the light has a wavelength of 0.4 μm or less.

13. The method of claim 10, wherein the conductive film contains titanium nitride.

14. The method of claim 11, wherein the substrate is heated to about 100 to 500° C. during,step f.).

15. The method of claim 10, wherein the high dielectric insulating film contains at least one of hafnium, zirconium, lanthanum, cerium, praseodymium, neodymium, yttrium and aluminum.

16. The method of claim 10, wherein a partial pressure of an oxygen gas or an oxygen compound gas is controlled during step c).

17. The method of claim 10, wherein the conductive film has a temperature of 850 to 950° C. during step c).

18. A method for forming a semiconductor device, comprising the steps of:

a) forming a high dielectric insulating film on a lower capacitor electrode;

b) irradiating a light on the high dielectric insulating film so as to reduce a crystal defect; and c) forming an upper capacitor electrode on the high dielectric insulating film after step b), wherein the high dielectric insulating film is a capacitor insulating film.

19. The method of claim 18, wherein the lower capacitor electrode is formed in the substrate.

20. The method of claim 19, wherein the lower capacitor electrode is placed in the region between trench isolations.

21. The method of claim 18, wherein the substrate is heated to about 300° C. during step b).

22. The method of claim 18, wherein the high dielectric insulating film contains at least one of hafnium, zirconium, lanthanum, cerium, praseodymium, neodymium, yttrium, and aluminum.

23. The method of claim 18, wherein a partial pressure of an oxygen gas or an oxygen compound gas is controlled during step b).

24. The method of claim 18, wherein the light has a wavelength of 0.4 μm or less.

* * * * *

UNITED STATES PATENT AND TRADEMARK OFFICE
CERTIFICATE OF CORRECTION

PATENT NO. : 7,094,639 B2
APPLICATION NO. : 10/662288
DATED : August 22, 2006
INVENTOR(S) : Masafumi Kubota et al.

It is certified that error appears in the above-identified patent and that said Letters Patent is hereby corrected as shown below:

On the title page
Item -56- "References Cited, U.S. PATENT DOCUMENTS", add:

-- 6,465,334 B1   10/02   Buynoski et al.
   6,797,651 B2   9/04    Hagino et al.
   6,682,973 *    1/04    Paton et al.
   5,187,116 *    2/93    Kitagawa et al.
2003/0175998 *   9/03    Nagano et al.
2005/0077548 *   4/05    Furukawa et al. --

On Title Page Item -56-
Under "FOREIGN PATENT DOCUMENTS", add:

--JP    09-219587    8/97
     CN    1372309A    10/02 --

On Title Page Item -56- Under "OTHER PUBLICATIONS", add:

-- NOTICE OF REASONS OF REJECTION (OFFICE ACTION), Mailing Date: April 19, 2005, Patent Application No. 2002-319909, Draft Date: April 12, 2005, Examiner: Eiichi Tanaka, Agent: Hiroshi MAEDA (and 7 other persons), pp. 1-3 (English translation) --

On Title Page, Item (57) "ABSTRACT" line 1: change the phrase "underlying insulting film" to -- underlying insulating film --

Signed and Sealed this

Twenty-fourth Day of April, 2007

JON W. DUDAS
*Director of the United States Patent and Trademark Office*